United States Patent
Gornicki et al.

[11] Patent Number: 5,910,235
[45] Date of Patent: Jun. 8, 1999

[54] ETCHING AND PIPELINED TEXTURING OF A SUBSTRATE IN A STATIONARY VACUUM DEPOSITION MACHINE

[75] Inventors: Stella Zofia Gornicki, Livermore; Douglas J. Krajnovich, San Jose, both of Calif.

[73] Assignee: Western Digital Corporation, Irvine, Calif.

[21] Appl. No.: 08/928,985

[22] Filed: Sep. 12, 1997

[51] Int. Cl.$^6$ .............................. C23C 14/34; C23F 4/02; B05D 3/06

[52] U.S. Cl. .................. 204/192.32; 204/192.2; 204/298.25; 216/65; 216/66; 216/87; 216/94; 427/129; 427/130; 427/554; 427/555; 427/556

[58] Field of Search ................ 204/192.32, 192.33, 204/192.2, 298.25; 216/62, 65, 66, 67, 87, 94; 427/129, 130, 554, 555, 556

[56] References Cited

U.S. PATENT DOCUMENTS

| | | | |
|---|---|---|---|
| 4,825,808 | 5/1989 | Takahashi et al. | 204/298.25 |
| 5,062,021 | 10/1991 | Ranjan et al. | 360/135 |
| 5,322,595 | 6/1994 | Sato et al. | 216/66 |
| 5,520,981 | 5/1996 | Yang et al. | 428/65.5 |
| 5,586,040 | 12/1996 | Baumgart et al. | 364/474.08 |
| 5,599,590 | 2/1997 | Hayashi et al. | 427/448 |

OTHER PUBLICATIONS

"Laser Texturing for Low–Flying–Height Media" by R. Ranjan, et al., J. Appl. Phys. 69(8), Apr. 15, 1991, pp. 5745–5747.

"A New Laser Texturing Technique for High Performance Magnetic Disk Drives" by P. Baumgart, et al., IEEE Transactions on Magnetics, vol. 31, No. 6, Nov. 1995, pp. 2946–2951.

"Safe Landings: Laser Texturing of High–Density Magnetic Disks" by Peter Baumgart, et al., Data Storage, Mar. 1996, pp. 21–24.

"Design of Laser Zone Texture for Low Glide Media" by D. Kuo, et al., Abstracts of 1996 Intermag Conference, Seattle, WA.

(List continued on next page.)

*Primary Examiner*—Nam Nguyen
*Assistant Examiner*—Rodney G. McDonald
*Attorney, Agent, or Firm*—Leo J. Young; Milad Shara

[57] ABSTRACT

A stationary vacuum deposition machine is used in a method for controlling the height of bumps formed in annular regions of substrates; the substrates are transported to the machine in a first condition in which each substrate is subject to a chemicapillary effect when subjected to localized thermal heating and melting. The machine includes a series of stations including an entrance station for receiving substrates into the machine, first and second predetermined stations, and a transport for operating in a cycle with each cycle including a transport phase and a stationary phase such that the transport causes all the substrates that are in the machine to be moved during the transport phase, and be temporarily held stationary during the stationary phase, such that during each stationary phase a predetermined one of the stations is occupied by one of the substrates while each of a plurality of others of the stations is occupied by a respective one of a plurality of others of the substrates. The machine also includes a plurality of vacuum deposition stations, each for operating during each stationary phase such that each vacuum deposition station causes a thin film to be deposited on a respective one of the substrates and an ion gun for etching a surface of the substrate occupying the first predetermined station while the substrate is held stationary, in an environment such that the first condition of the substrate is changed to a second condition that substantially reduces its susceptibility to the chemicapillary effect. The machine also includes a main chamber for providing an environment that reduces the substrate's risk of reversion to the first condition when the transport moves the substrate from the first predetermined station to the second predetermined station and scanning beam generator for directing a scanning beam at the substrate occupying the second predetermined station while the substrate is held stationary to form the bumps in the annular region of the substrate, wherein the height of bumps is controlled.

9 Claims, 8 Drawing Sheets

OTHER PUBLICATIONS

"Laser Zone Texture on Alternative Substrate Disks" by E. Teng, et al., Abstracts of 1996 Intermag Conference, Seattle, WA.

"Effects of Laser–Induced Discrete Texture Parameters on Optimization of HDI Tribology" by Jack Xuan, et al., Abstracts of 1996 Intermag Conference, Seattle, WA.

"Tribological Behavior of Rigid Disks with High Density Micro Cone–Shaped Projections" by J. Kozu, et al., Abstracts of 1996 Intermag Conference, Seattle, WA.

"Scanner Refinements Inspire New Uses" by Gerald F. Marshall, Laser Focus World, Jun. 1994, pp. 57–63.

"Flex Spatial Light Modulators", Meadowlark Optics, 1997–1998 Catalog, pp. 52–55.

"LZT—1000 Laser Zone Texturing Tool", Preliminary Spec Sheet, May 1996.

"Circulus M12 Hard Disks Manufacturing System" by B. Cord, et al., BPS—Symposium '95, 12 pp.

"Fourier Series and Optical Transform Techniques in Contemporary Optics" by Raymond G. Wilson, et al., Fourier Spectra for Non–Periodic Functions, A Wiley–Interscience Publication, 1995, Chapter 5 pp. 99–129; Chapter 9 pp. 243–249.

"Experimental and Theoretical Studies of Bump Formation During Laser Texturing of Ni–P" by D. Krajnovich, et al., Abstracts of 1996 Intermag Conference, Seattle,WA.

"Experimental and Theoretical Studies of Bump Formation During Laser Texturing of Ni–P Disk Sustrates" by A.C. Tam, et al., IEEE Transactions on Magnetics, vol. 32, No. 5, Sep. 1996, pp. 3771–3773.

Tam et al., "Experimental and theoretical Studies of Bump Formation During Laser Texturing of Ni–P Disk Substrates", IEEE Transactions on MAgnetics, vol. 32, No. 5, pp. 3771–3773, Sep. 1996.

)# ETCHING AND PIPELINED TEXTURING OF A SUBSTRATE IN A STATIONARY VACUUM DEPOSITION MACHINE

CROSS-REFERENCES TO RELATED APPLICATIONS

This application is related to a co-pending U.S. Patent Application, "Pipelined Texturing of a Substrate in a Stationary Vacuum Deposition Machine," filed on Aug. 26, 1997.

BACKGROUND OF THE INVENTION

1. Field of the Invention

This invention relates to processing of a substrate in making a disk to be used in a fixed disk disk drive. More particularly, it relates to using a vacuum deposition machine to sputter etch an inner annular region or landing zone of a substrate prior to laser texture of the landing zone.

2. Description of the Prior Art and Related Information

The overall cost and performance of a contemporary fixed-disk disk drive, such as a magnetic hard disk drive, depend significantly on the cost and performance of each magnetic disk within the drive.

The cost of manufacturing magnetic disks depends in part on the cost and efficiency of operation of various machines used to carry out numerous processes involved in manufacturing the disks. These processes include texturing processes. Typically, one machine is used for "full-surface" texturing and another machine is used for landing zone texturing. An example of a machine for landing zone texturing is a standalone laser texturing machine which includes a rotating and translating spindle that rotates a substrate while a stationary pulsed laser beam is directed at the rotating substrate causing bumps to be formed in the landing zone of the substrate.

The standalone machine typically laser textures one substrate at a time and its throughput may be severely limited by factors such as the substrate handling time. Also, the cost of the laser texturing machine may constitute a significant portion of the overall cost of manufacturing the disks.

The manufacturing of magnetic disks also typically involves the use of a stationary vacuum deposition machine. (In this art, a stationary vacuum deposition machine is commonly called a stationary sputtering machine, and the two different terms are used interchangeably herein.). An alternate machine is an in-line sputtering machine. Either type of machine is used to, among other things, deposit a succession of thin film layers on a substrate. The thin film layers may include an underlayer, a magnetic layer, and a carbon overcoat layer. A typical stationary sputtering machine includes a series of stations. The series of stations includes a load station, a plurality of sputtering stations, a cooling station, a heating station, and an unload station. Each station has a per-stage processing time of typically approximately 5 to 7 seconds. The sputtering stations are used to sputter the succession of thin film layers on a substrate; typically, both sides of the substrate are sputtered with the succession of thin film layers. Among the series of stations, a plurality of spare stations are also usually included. The cost of a sputtering machine adds a significant portion to the overall cost of manufacturing the disks.

The performance of a fixed-disk disk drive depends in part on structures that affect the startup of operation of the drive. In a typical disk drive, a slider lands in the landing zone when the disk drive is powered down. Texturing of the landing zone reduces the effective contact area between the slider and the surface of the landing zone thereby reducing the static friction forces ("stiction") that must be overcome to separate the slider from the surface of the landing zone when the disk drive is powered on. Such a reduction of static friction forces improves the performance of the disk drive.

Researchers in the field have attempted to explain and control the formation of bumps in a landing zone of a substrate such as a nickel-phosphorous (Ni-P) plated substrate. For example, the publication "Experimental and Theoretical Studies of Bump Formation During Laser Texturing of Ni-P Disk Substrates" by Tam et al., discloses a model for the formation of sombrero-shaped bumps based on competition between temperature gradients ("thermocapillary effect") and surface composition gradients ("chemicapillary effect"). The chemicapillary effect is a surface composition gradient which produces a surface tension gradient; the surface tension gradient controls the flow of material from low to high tension. The publication discloses that because of the competition between thermocapillary and chemicapillary effects, either sombrero-shaped bumps or rim only bumps are formed by a Gaussian shaped laser beam depending on the laser parameters chosen.

A need exists in the art to reduce the costs of manufacturing the disks. Additionally, a need exists in the art to improve the control of the height of bumps formed in a landing zone of a substrate.

SUMMARY OF THE INVENTION

This invention can be regarded as a method for using a stationary vacuum deposition machine to control the height of bumps formed in an annular region of a substrate in making a magnetic hard disk. The machine has a controllable transport means and a series of stations. The series of stations includes stations to which the controllable transport means sequentially moves the substrate and at each of which a thin film layer is deposited onto the substrate. The series of stations also includes first and second predetermined stations. The method includes the steps of transporting the substrate to the machine such that the substrate is in a first condition in which it is subject to a chemicapillary effect when subjected to localized thermal heating and melting, loading the substrate into the machine and controlling the transport means to cause the substrate to be moved into, and then be temporarily held stationary in, the first predetermined station. The method also includes the steps of etching a surface of the substrate while it is held stationary in the first predetermined station in an environment such that the first condition of the substrate is changed to a second condition that substantially reduces its susceptibility to the chemicapillary effect, controlling the transport means to cause the substrate to be moved out of the first predetermined station and into, and then be temporarily held stationary in, the second predetermined station such that the substrate is moved from the first predetermined station to the second predetermined station in an environment that reduces risk of reversion to the first condition, and directing a scanning beam at the substrate while it is held stationary in the second predetermined station to form the bumps in the region of the substrate, wherein the height of bumps is controlled.

This invention can also be regarded as a stationary vacuum deposition machine for use in a method for controlling the height of bumps formed in annular regions of substrates, the substrates transported to the machine in a first condition in which each substrate is subject to a chemicapillary effect when subjected to localized thermal heating and melting. The machine includes a series of stations including an entrance station for receiving substrates into the machine, and first and second predetermined stations, transport means for operating in a cycle with each cycle including a transport phase and a stationary phase such that the transport means causes all the substrates that are in the machine to be moved during the transport phase, and be temporarily held stationary during the stationary phase, such that during each stationary phase a predetermined one of the stations is occupied by one of the substrates while each of a plurality of others of the stations is occupied by a respective one of a plurality of others of the substrates. The machine also includes a plurality of station vacuum deposition means, each for operating during each stationary phase such that each station vacuum deposition means causes a thin film to be deposited on a respective one of the substrates and etching means for etching a surface of the substrate occupying the first predetermined station while the substrate is held stationary, in an environment such that the first condition of the substrate is changed to a second condition that substantially reduces its susceptibility to the chemicapillary effect. The machine also includes environment means for providing an environment that reduces the substrate's risk of reversion to the first condition when the transport means moves the substrate from the first predetermined station to the second predetermined station and scanning beam generating means for directing a scanning beam at the substrate occupying the second predetermined station while the substrate is held stationary to form the bumps in the annular region of the substrate, wherein the height of bumps is controlled.

DESCRIPTION OF PREFERRED EMBODIMENTS

Figure 1:
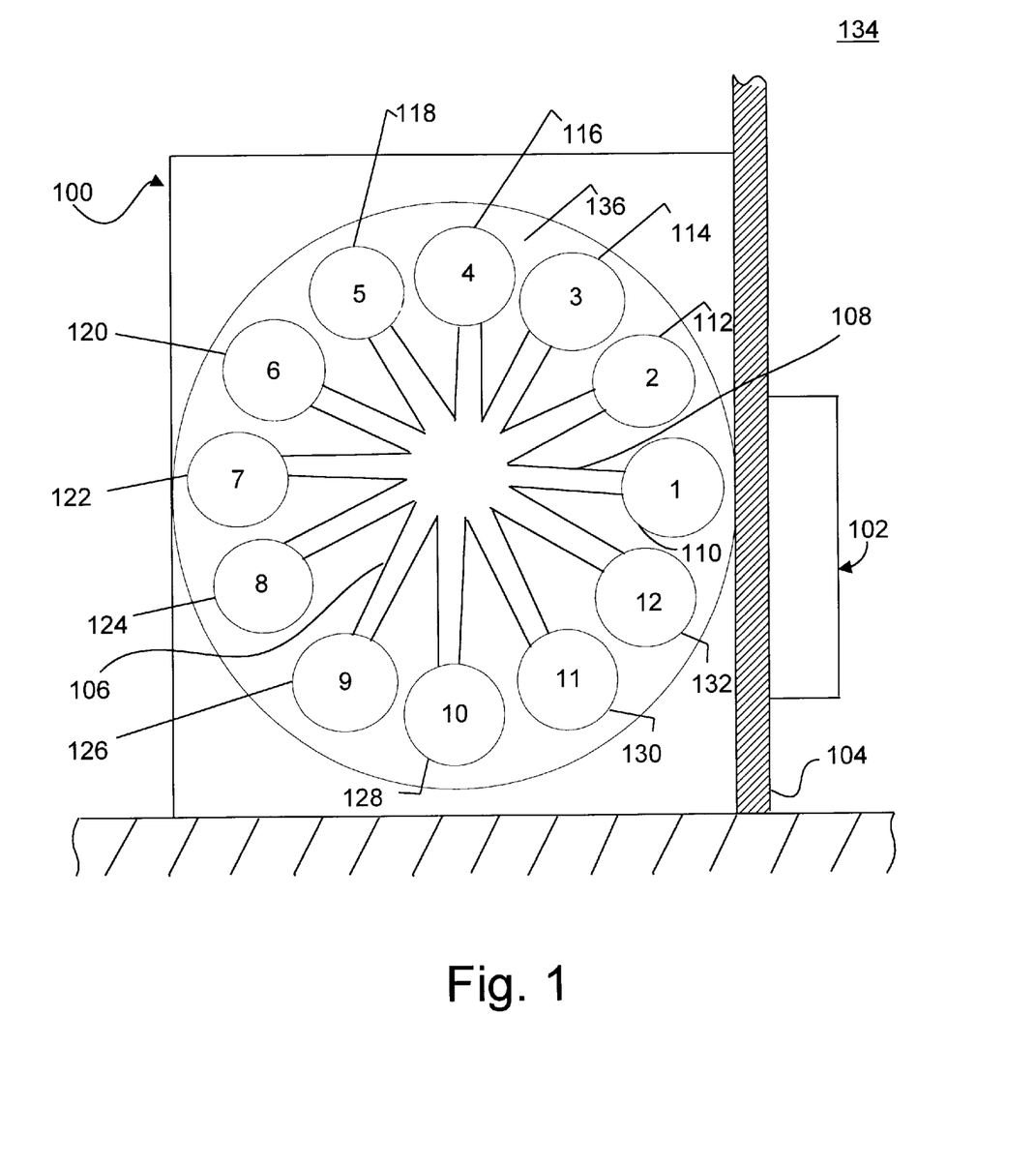
FIG. 1 is a side view of a stationary sputtering machine which incorporates an embodiment of this invention.

With reference to FIG. 1, a machine 100, referred to herein interchangeably as either a stationary vacuum deposition machine or a stationary sputtering machine, includes a robot 102, a series of stations 110 to 132 within an environmental control means such as a main chamber generally denoted by 136, and a transport means such as a centrically beared wheel 106. Wheel 106 includes radially disposed grippers such as gripper 108, a portion of which is shown in FIG. 1. A wall 104 separates series of stations 110 to 132 from a cleanroom 134.

In operation, cassettes (not shown) of substrates made from metal, glass, or ceramic are transported to machine 100 such that the cassettes are positioned in front of robot 102 in cleanroom 134; an example of a metal substrate is an aluminum substrate which is typically plated with a layer of nickel-phosphorous. The substrates are transported to machine 100 in a first condition in which each substrate is subject to a chemicapillary effect when subjected to localized thermal heating and melting such as heating and melting induced by a laser. Robotic arms (not shown) within robot 102 load each substrate in sequence, one at a time, from a cassette into an entrance station 110. From entrance station 110, each substrate is transported by wheel 106 in a pipeline process to each station for per stage processing.

Wheel 106 is controlled by operating in a cycle where each cycle includes a transport phase and a stationary phase. During the transport phase, wheel 106 rotates counter-clockwise such that gripper 108 transports the substrate in entrance station 110 to one of a succession of predetermined stations, such as a station 112. Concurrently, robot 102 loads another substrate from the cassette into entrance station 110. The process of loading each substrate irito entrance station 110 as wheel 106 rotates counter-clockwise continues until all of the substrates from each cassette have been loaded into entrance station 110.

Figure 7A:
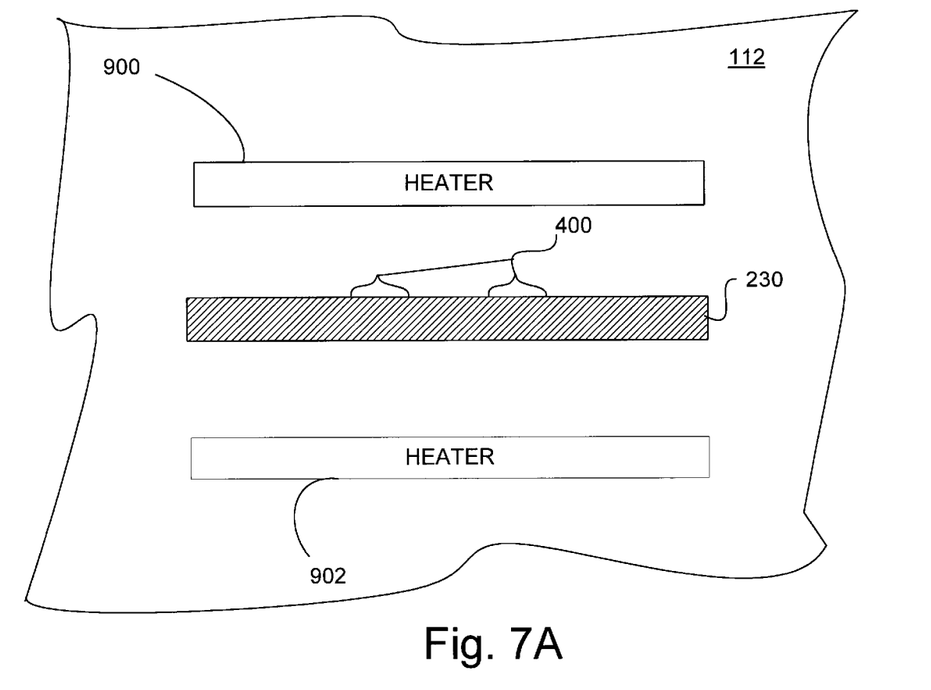
FIG. 7A schematically represents a portion of a station, such as station 112 shown in FIG. 1, used to preheat both sides of a substrate.

During the stationary phase, station 112 performs per-stage processing such as preheating the substrate while it is temporarily held stationary in the station by gripper 108. The preheating occurs for a period of time allocated for per-stage processing within machine 100, typically approximately 5 to 7 seconds per stage. The substrate, such as substrate 230 (FIG. 4A), is heated to a predetermined start temperature, e.g., 230 degrees C as shown in FIG. 7A. As shown, heaters 900 and 902 are positioned on each side of substrate 230.

Figure 7B:
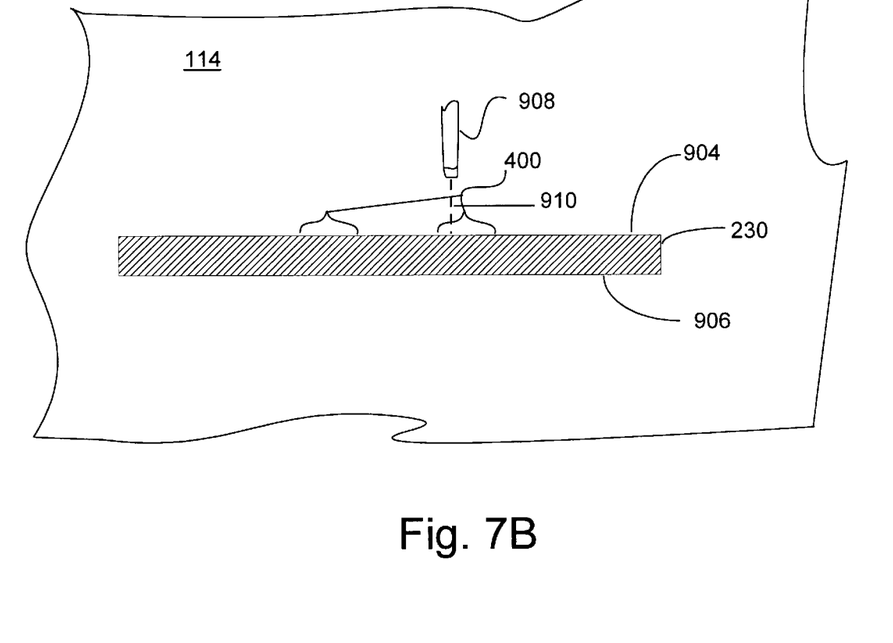
FIG. 7B schematically represents a portion of a station, such as station 114 shown in FIG. 1, used to sputter etch one side of a substrate.

The substrate is then transported or moved to a station 114. With reference to FIG. 7B, station 114 contains an etching means such as an ion gun 908 which directs ("sprays") a stream of ions represented by a dashed line 910 to a landing zone 400 of a surface, e.g. top surface 904, of substrate 230 to perform a sputter etch of the surface to change the condition of the substrate. The sputter etch is performed in an environment, preferably, vacuum, to change the first condition of the substrate (i.e., the condition of each substrate prior to sputter etching) to a second condition that substantially reduces the substrate's susceptibility to the chemicapillary effect. The sputter etch removes a plurality of monolayers from the surface of landing zone 400, preferably in the range of 1 to 1000 monolayers, such that compositions such as surface oxides and contaminants are removed leaving substantially the bulk material of the substrate. A second ion gun (not shown) may be positioned on the other side of substrate 230 such that its bottom surface 906 is also sputter etched. Alternatively, plasma etching may be performed by applying electrical power (either RF or DC) to the substrate in the presence of a suitable gas such as argon. While sputter etching is preferred, a non-sputter etch may also be performed by using, e.g., laser etching.

Significantly, the per stage processing which occurs in stations 112 and 114 allows the height of the bumps to be controlled when the bumps are formed in station 116. The preheating of the substrate controls the melt duration which influences the height of the bumps. For example, if the predetermined start temperature is higher, the resolidification time increases which gives additional time for capillary forces to try to restore a flat surface, i.e., the bump height should be reduced. The sputter etch removes monolayers from the substrate which may reduce the effects of the chemicapillary effect in the formation of bumps; hence, the formation of bumps may be influenced primarily by the thermocapillary effect which results in greater control of the bump height.

After the sputter etch, the substrate is transported to station 116 by wheel 106. Since main chamber 136 provides an environment, preferably, vacuum, the environment reduces the substrate's risk of reversion to the first condition when wheel 106 moves the substrate from station 114 to station 116. At station 116, a scanning beam generating means such as a laser texturing apparatus 201 (FIG. 2) directs a scanning beam such as a laser beam 202 (FIG. 2) at the substrate while it is held stationary in the station. Station 116, preferably contains an inert atmosphere or a vacuum may exist in station 116. Preferably, the inert atmosphere includes noble gases such as argon, helium, neon, or krypton. The texturing operation will be described in more detail below with reference to FIG. 2. The substrate is then transported to a station 118 where it is heated for a second period of time. Alternatively, both per-stage heating processes can occur after or before the laser zone texturing operation. The substrate is next transported to a succession of stations 120 and 122, each of which contains a station vacuum deposition means such as the structure shown in FIGS. 8A and 8B, respectively; each structure is controlled to operate during each stationary phase of wheel 106.

Figure 8A:
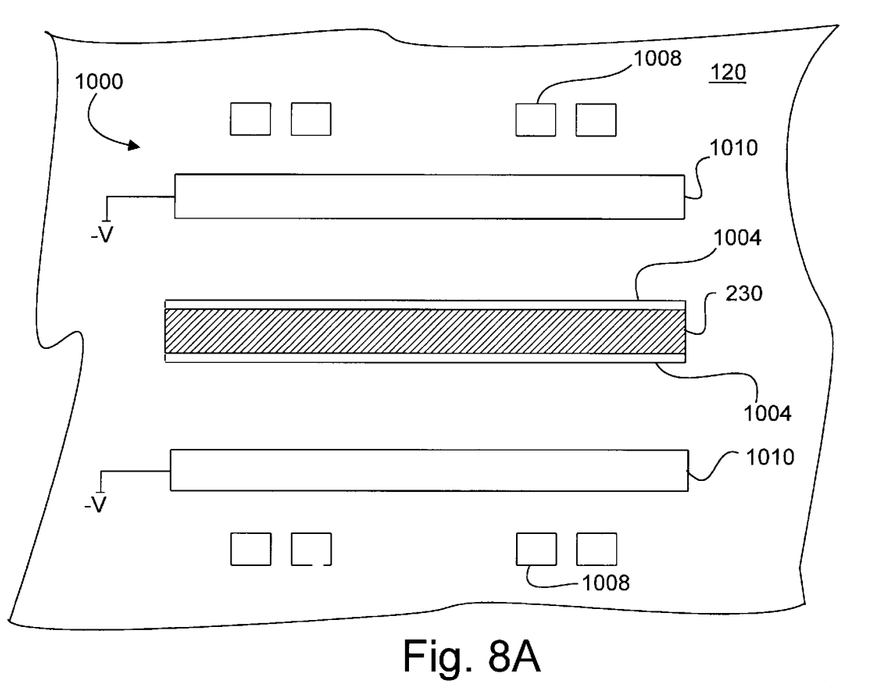
FIG. 8A schematically represents a portion of a station, such as station 120 shown in FIG. 1, used to deposit an underlayer on both sides of a substrate.
Figure 8B:
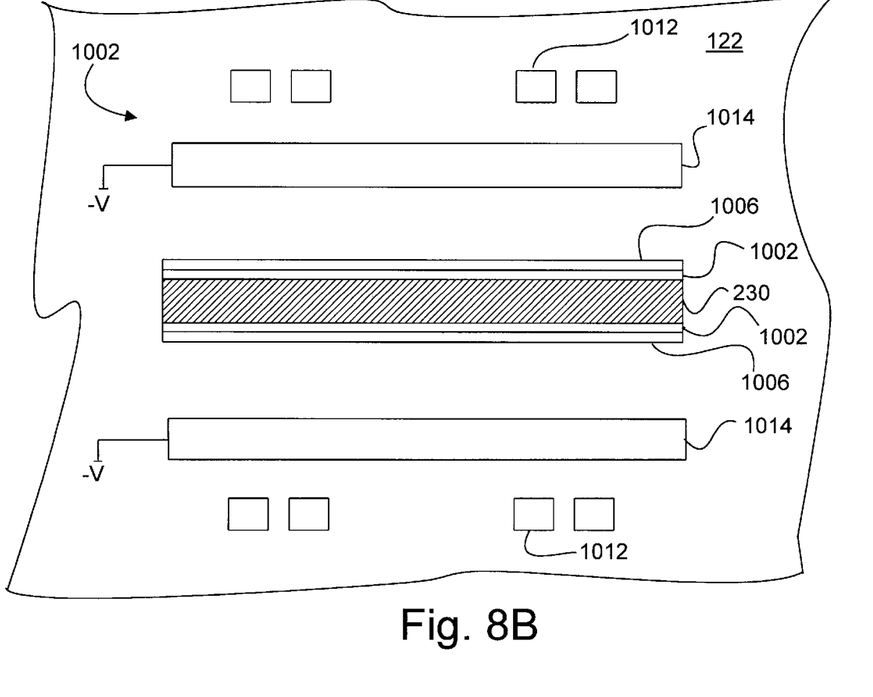
FIG. 8B schematically represents a portion of a station, such as station 122 shown in FIG. 1, used to deposit a magnetic layer on both sides of a substrate.

With reference to FIG. 8A, a thin film such as an underlayer 1004 is deposited on both sides of substrate 230 by, preferably, a sputtering means such as an underlayer sputtering mechanism generally indicated by 1000 in station 120. Mechanism 1000 includes a plurality of magnets 1008 and a target 1010 positioned on each side of the substrate. Suitably, the magnets can be either permanent magnets or electromagnets, and the targets are chromium-vanadium targets with each target biased at a negative voltage. In FIG. 8B, a sputtering means such as a magnetic layer sputtering mechanism generally indicated by 1002 is preferably used to deposit a thin film magnetic layer 1006 above underlayer 1004 on both sides of the substrate in station 122. Mechanism 1002 includes a plurality of magnets 1012 and a target 1014 positioned on both sides of the substrate. Each target is biased at a negative voltage. Suitably, the targets are cobalt alloy targets.

Continuing with FIG. 1, wheel 106 transports the substrate to a spare station 124 and to a station 126 which is used to cool the substrate. At stations 128 and 130, a thin film layer of carbon is deposited above the magnetic layer in each station. Again, both sides of the substrate are deposited, e.g., by sputtering, with the thin film layers of carbon. The substrate is transported to an exit station 132 where robot 102 unloads the substrate. Other types of processing may be applied to the substrate in the course of making a magnetic hard disk, such as adding a lubricant to the thin film layers of carbon. Also, other types of vacuum deposition techniques may be used in machine 100 such as Ion Beam Deposition, chemical vapor deposition ("CVD"), and plasma-enhanced chemical vapor deposition ("PECVD").

Figure 2:
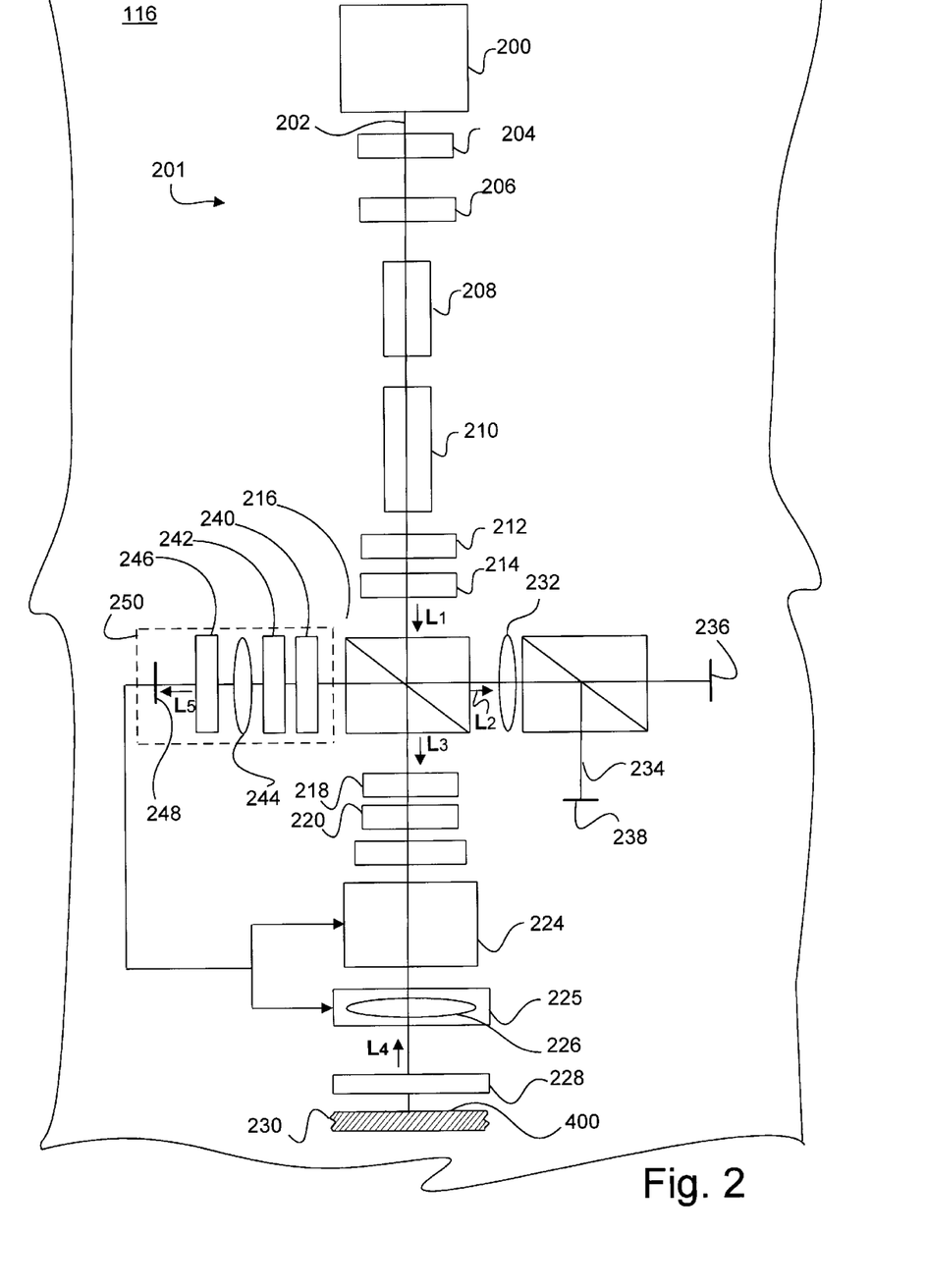
FIG. 2 is the general construction of a laser texturing apparatus that is incorporated in the machine of FIG. 1 and a representative substrate; preferably, one of the stations shown in FIG. 1 includes such laser texturing apparatus for each of the sides of the substrate.

With reference to FIG. 2, a laser texturing apparatus 201 includes a plurality of components 200-250. Substrate 230 does not form a part of apparatus 201. A laser 200, such as a Spectra-Physics V70 or B10 vanadate laser, generates laser beam 202. Suitably, laser beam 202 has a Gaussian shaped energy distribution. Laser beam 202 passes through a Faraday isolator 204, a mechanical variable attenuator 206, and a beam expander 208. Faraday isolator 204 changes the polarization of laser beam 202 to protect laser 200 when a portion of laser beam 202 reflects back from a surface of substrate 230. Attenuator 206 may be used to attenuate laser beam 202. Beam expander 208 expands the size of laser beam 202 by a suitable amount such as 3× or 6× its size depending on the laser used. Laser beam 202 then passes through another beam expander 210, a variable retarder 212, and a polarizer 214. Beam expander 210 such as a Rodenstock beam expander is used to expand laser beam 202 to a suitable amount, e.g., 2 to 8× the size of the laser beam received at its input. Variable retarder 212 and polarizer 214 are used to electronically control the attenuation of the power of laser beam 202. Laser beam 202, denoted by L1, is received at the input of a polarizing beamsplitter 216.

Beamsplitter 216 splits laser beam L1 such that most of it, denoted by L3, passes through to strike substrate 230 via elements 218 to 228 while a small portion of it, denoted by L2 passes through to an average power detector 236 and pulse width detector 238 via elements 232 and 234. Element 232 is a best form singlet lens and element 234 is a non-polarizing beamsplitter. Average power detector 236 detects the average power of laser beam L2 while pulse width detector 238 detects its pulse width, suitably in nanoseconds. Laser beam L3 passes through a variable retarder 218 such as a ferroelectric liquid crystal retarder and a polarizer 220 which together form a fast shutter; alternatively, a mechanical shutter may be used. Laser beam L3 then passes through a quarter wave retarder 222, a scan mechanism 224, a scan lens 226 within a moveable module 225, and a window 228 to strike landing zone 400 of substrate 230. Scan lens 226 is suitably mounted on a computer-controlled stage which includes a translation stage and a two-axis tilt stage. Retarder 222 allows most of the reflected laser beam, denoted by L4, to be directed to an auto-focus sensor 250. Suitably, scan mechanism 224 may be an x-y galvo scanner and scan lens 226 may comprise a plurality of lens in series having a focal length of approximately 100 millimeters (mm). Also, the minimum distance between window 228 and substrate 230 is suitably approximately 25 mm.

A portion of the incident laser beam L3 is reflected back from substrate 230 and passes through window 228, scan lens 226, scan mechanism 224, retarder 222, polarizer 220, and retarder 218. The reflected portion, denoted by L4, is reflected off beamsplitter 216 such that a portion of laser beam L4, denoted by L5, passes to auto-focus sensor 250 which is used to focus the laser beam onto the substrate.

Auto focus sensor 250 includes a half wave retarder 240, a polarizer 242, a spherical lens 244, a cylindrical lens 246, and a focus detector 248. Retarder 240 and polarizer 242 function as a variable attenuator. Suitably, focus detector 248 may be a four quadrant detector. Spherical lens 244 provides most of the focusing power while cylindrical lens 246 adds astigmatism. The astigmatism causes rays from sagittal and meridian sections to focus at different axial locations. At the tangential and sagittal foci, the images are horizontal and vertical lines, respectively. When the laser beam is optimally focused, the image is a circle halfway between the tangential and sagittal foci. The focus is adjusted by controlling the position of scan lens 226 via module 225 until the output of the horizontal and vertical quadrants are matched. A second apparatus 201 (not shown) may be positioned on the other side of substrate 230 in station 116 such that both sides of substrate 230 are laser textured simultaneously; in that embodiment, each apparatus 201 may have a dedicated laser such as laser 200 or a single laser may be used for both apparatuses.

The operation of apparatus 201 will now be explained primarily with reference to FIGS. 2–4B. Prior to the actual texturing of substrate 230, suitably, laser beam 202 is focused on substrate 230 via an autofocus operation, the scanning direction of laser beam 202 is determined, and the vibration of substrate 230 is attenuated; the above three operations are collectively referred to as control operations. The vibration of substrate 230 may occur when the substrate is transported to station 116 by wheel 106.

Figure 4A:
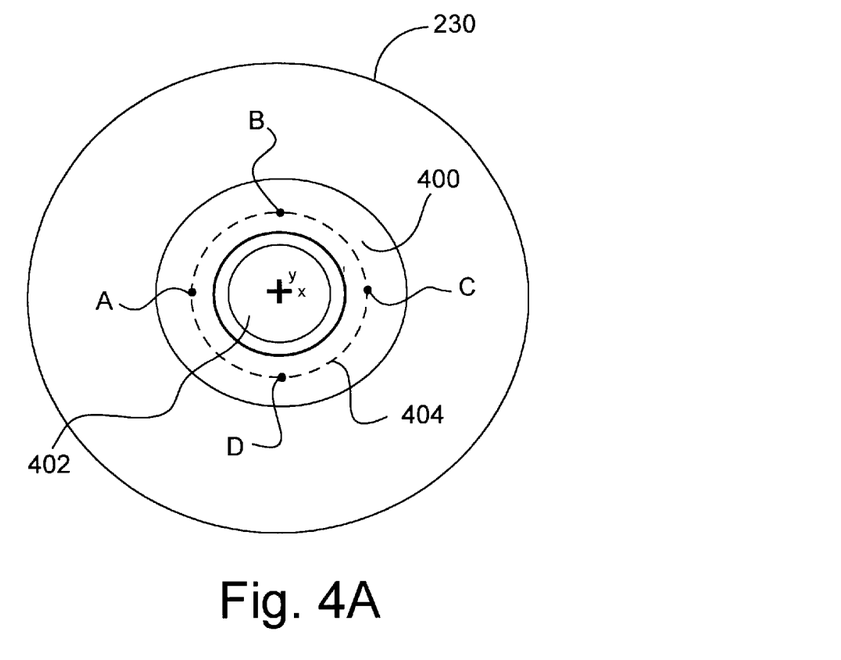
FIG. 4A is a plan view of a substrate such as the substrate shown in FIG. 2, with a landing zone textured by laser texturing.
Figure 4B:
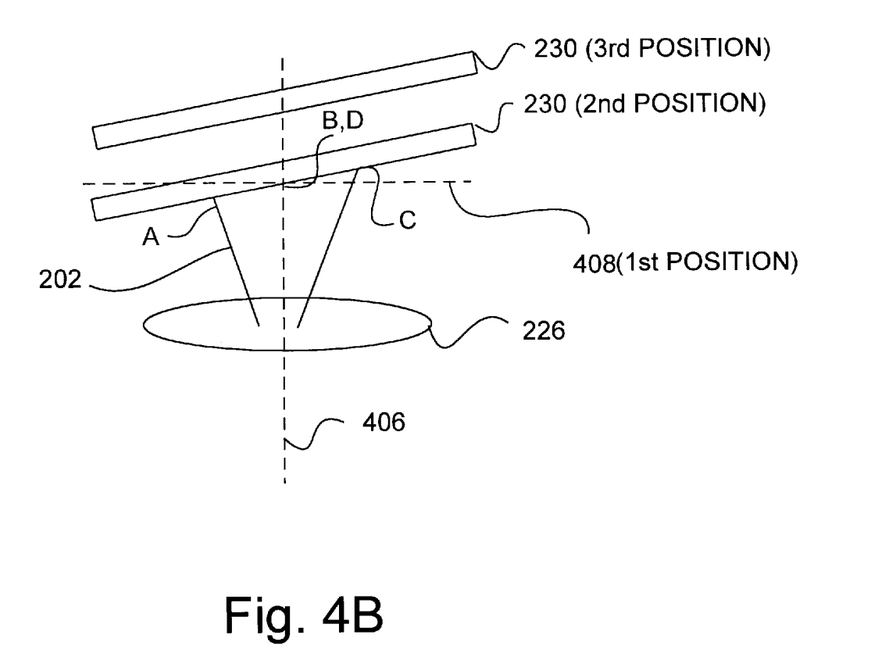
FIG. 4B schematically represents various possible positions that a substrate can occupy relative to a scan lens when the substrate is initially transferred into a station such as station 116 of the machine shown in FIG. 1.

In an autofocus operation, the scan lens such as scan lens 226 is preferably moved while the substrate such as substrate 230 is held stationary. Moreover, laser beam 202 scans the substrate in a circle at least once at reduced laser power to prevent the laser beam from texturing the substrate. When the scanning occurs, substrate 230 may assume one of several possible positions relative to an optical axis 406 of scan lens 226, three positions of which are shown in FIG. 4B.

The first position, denoted by a dashed line 408, represents an "in-focus" or focused condition of the laser beam; in this condition, laser beam 202 strikes the substrate at an angle which is perpendicular to a surface of the substrate and scan lens 226 is at a suitable distance from the surface. The second and third positions each represent an "out-of-focus" or unfocused condition of the laser beam. For example, when the substrate is in the second position, the laser beam scans the substrate at points such as points a to d as shown in FIGS. 4A and 4B. Each of points a to d in FIG. 4B correspond to points a to d on dashed circular line 404 in FIG. 4A. At points a and c, the substrate is too close and too far, respectively from scan lens 226. At points b and d, the substrate is at an in-focus distance from the scan lens.

Figure 3:
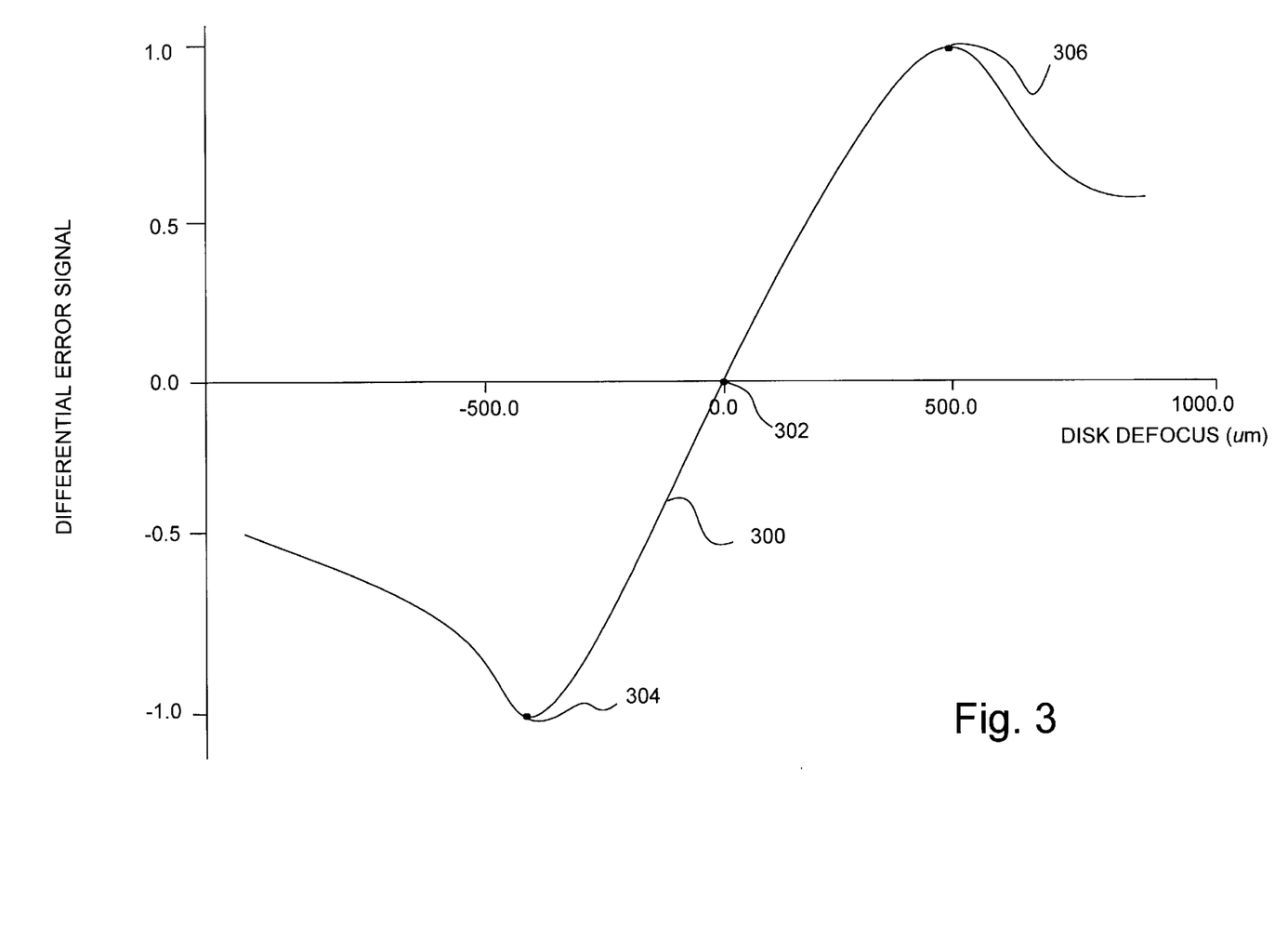
FIG. 3 is a graph of a differential error signal versus the out-of-focus distance of a substrate when a laser beam strikes the substrate.

Based on a reflected portion of laser beam 202 which is detected by focus detector 248, focus detector 248 generates an error signal. For example, if a four quadrant detector was used as focus detector 248, then the error signal is generated based on an equation such as (A−B)+(C−D) where A,B,C, D are consecutive quadrants in the four quadrant detector. An error signal such as the differential error signal shown in FIG. 3 is generated by focus detector 248. Error signals 306 and 304 approximately correspond to points c and a, respectively, as shown in FIGS. 4A and 4B. Error signal 302 approximately corresponds to points b and d, respectively, as shown also in FIGS. 4A and 4B. Error signal 302 represents the in-focus condition. The output of focus detector 248 is then used to adjust the position of scan lens 226 to correct for the focus error. For example, scan lens 226 is adjusted in the pitch and/or yaw directions by moving the two-axis tilt stage to correct for the focus error. When the substrate is in the third position, scans lens 226 is moved or translated towards the substrate by moving the translation stage as well as making the pitch and/or yaw adjustments to correct the focus error. Scans lens 226 can also be translated away from the substrate. Once laser beam 202 is focused on the substrate, the scanning direction is determined.

The scanning direction is determined such that the scan of the laser beam during texturing occurs concentric about the center of hole 402 in substrate 230. An offset between optical axis 406 and the center of hole 402, represented by the intersection of the x-y axis, is detected by scanning laser beam 202 in the x and y directions at reduced laser power. An x-y galvoscanner is used as scanning mechanism 224 in this example. When the laser beam is scanned in the x direction or horizontally, focus detector 248 receives a portion of the reflected laser beam such that a signal representing the reflected laser beam is generated. The signal contains a null where the laser beam is not reflected such as at hole 402 in substrate 230. Based on this signal, focus detector 248 determines the horizontal offset of the center of hole 402 relative to optical axis 406. Likewise, the vertical offset or the offset in the y direction is determined. The x-y galvoscanner is then suitably programmed to scan the substrate based on the determined horizontal and vertical offsets such that the scanning occurs substantially concentric to the center of hole 402. The auto-focus and the scanning direction determination operations are conducted each time a substrate is transferred to station 116. After the substrate is transferred out of station 116, scan lens 226 is returned to a default position.

Figure 5:
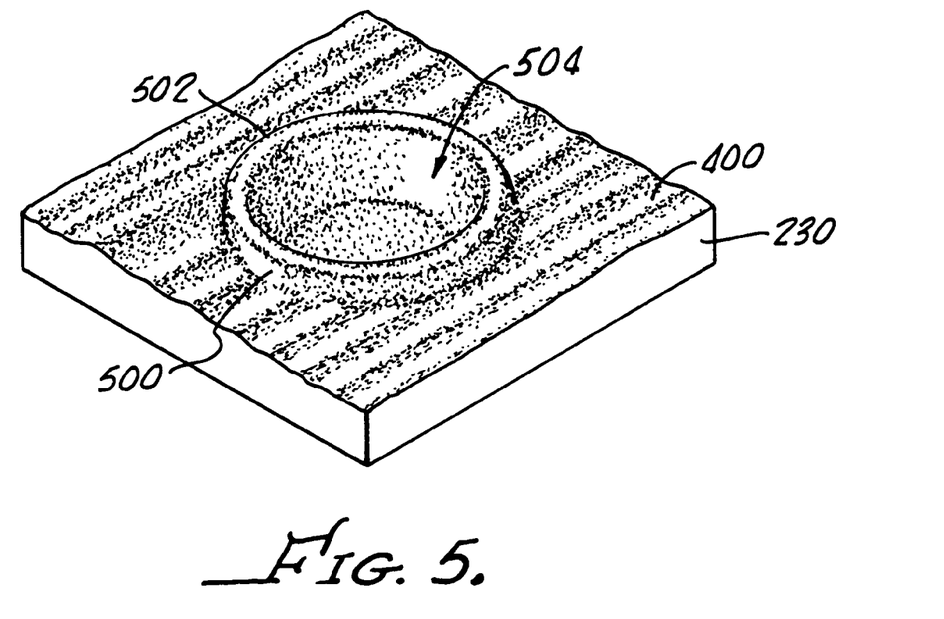
FIG. 5 is a perspective view of a portion of a substrate having a rim only bump formed in a landing zone of the substrate shown in FIG. 4A.

The vibration of substrate 230 is attenuated by employing dampening fingers or other suitable mechanical means. After the control operations are completed, the texturing of an annular region, preferably, an inner annular region such as landing zone 400 commences at an increased laser power such that bumps are formed as shown in FIG. 5. The texturing occurs such that the scanning of laser beam 202 is a concentric spiral about hole 402. Landing zone 400 can also be located in other annular regions of the substrate such as the outer annular region.

With reference to FIG. 5, landing zone 400 includes a plurality of bumps, only one of which is shown, formed by apparatus 201 shown in FIG. 2. A bump such as bump 500 typically includes a rim 502 and a cavity 504.

Figure 6A:
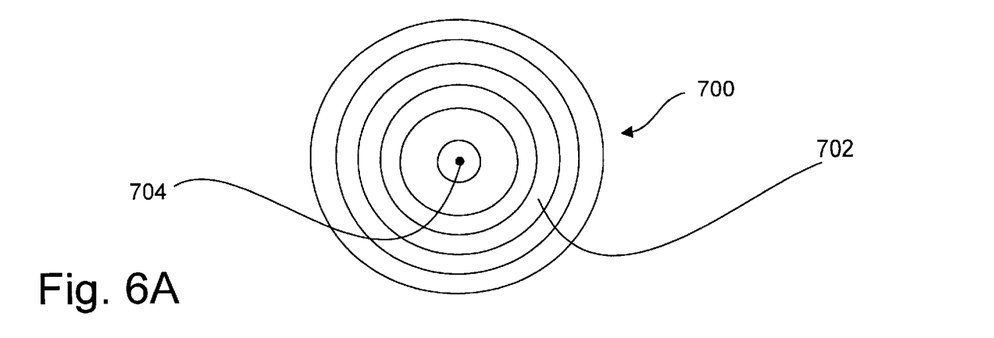
FIG. 6A is an intensity contour map of a laser beam according to another embodiment of this invention.
Figure 6B:
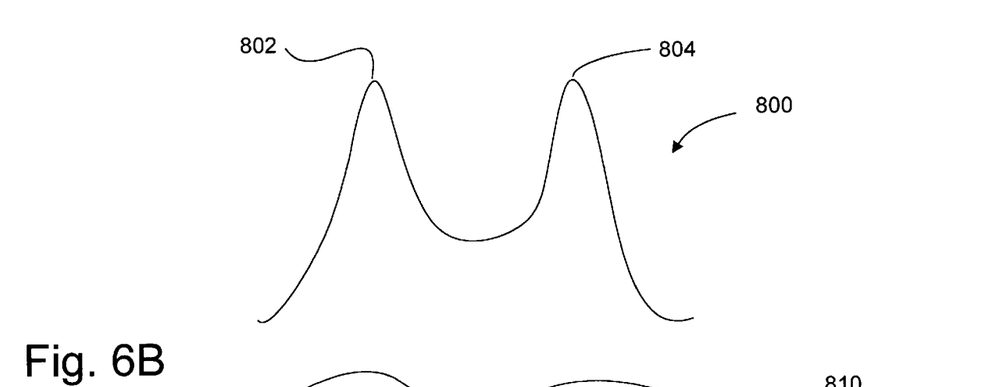
FIG. 6B is a cross section view of an energy distribution of the intensity contour map shown in FIG. 6A.

With reference to FIG. 6A, a laser beam, which is different than the typical Gaussian shaped laser beam used in the prior art to laser texture landing zones, includes an intensity contour map 700. Contour map 700 includes a plurality of annular portions concentric about an axis 704. The energy of the laser beam is concentrated in one of the annular portions, annular portion 702. With reference to FIG. 6B, a cross section 800 of contour map 700 defines an energy distribution which is characterized by a plurality of maximum energy peaks such as peaks 802 and 804. Peaks 802 and 804 correspond to annular portion 702. The laser beam having such a cross section may be implemented within the apparatus shown in FIG. 2 in conjunction with the machine shown in FIG. 1. The sputter etch performed in station 114 (FIG. 1) "turns off" the chemicapillary effect when a substrate is laser textured in station 116 (FIG. 1). Hence, in station 116, the bumps formed by the laser having cross section 700 stem from the thermocapillary effect alone. Each bump includes a central protrusion surrounded by a cavity and a rim.

Figure 6C:
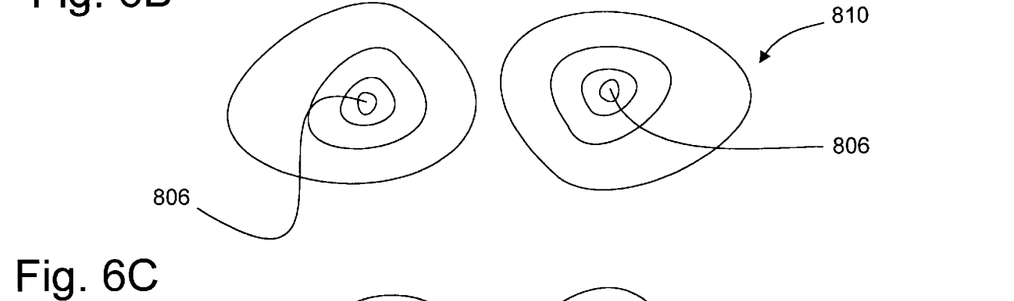
FIG. 6C is an intensity contour map of a laser beam according to another embodiment of this invention.
Figure 6D:
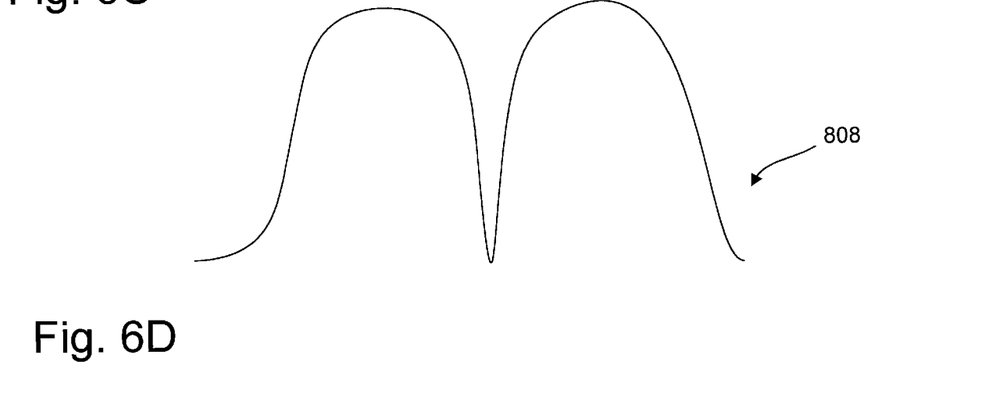
FIG. 6D is a cross section view of an energy distribution of the intensity contour map shown in FIG. 6C.

Other laser beams having different energy distributions may be used to form bumps similar to the ones formed by the laser beam represented by FIGS. 6A and 6B. For example, a laser beam having the intensity contour map and cross section shown in FIGS. 6C and 6D, respectively, may be used. In FIG. 6C, substantially most of the energy of the laser beam is concentrated in the central portions 806 of intensity contour map 810. In FIG. 6D, a cross section 808 of contour map 810 defines an energy distribution such that each peak corresponds to a central portion 806. The laser beams represented in FIGS. 6A and 6C may be generated by an apparatus using suitable Fourier optics techniques. Suitably, a 2-D addressable spatial light modulator may be positioned between beam expanders 208 and 210 in the apparatus shown in FIG. 2 to generate such laser beams.

Significantly, this invention takes advantage of the relatively high throughput of a stationary sputtering machine by conducting laser zone texturing of substrates in one of the spare stations. By doing so, a separate standalone laser zone texturing machine is eliminated in the making of magnetic hard disks which reduces the capital equipment costs. Also, the preheating and etching of a substrate improves the control of the height of the bumps formed in a landing zone of the substrate.

We claim:

1. A method for using a stationary vacuum deposition machine to control the height of bumps formed in an annular region of a substrate in making a magnetic hard disk, the machine having controllable transport means and a series of stations including stations to which the controllable transport means sequentially moves the substrate and at each of which a film layer is deposited onto the substrate and including first and second stations, the method comprising the steps of:

transporting the substrate to the machine such that the substrate is in a first condition in which it is subject to chemicapillary and thermocapillary effects when subjected to localized thermal heating and melting;

loading the substrate into the machine;

controlling the transport means to cause the substrate to be moved into, and then be temporarily held stationary in, the first station;

etching a surface of the substrate while it is held stationary in the first station in an environment such that the first condition of the substrate is changed to a second condition that substantially reduces its susceptibility to the chemicapillary effect;

controlling the transport means to cause the substrate to be moved out of the first station and into, and then be temporarily held stationary in, the second station such that the substrate as it is moved from the first station to the second station, is maintained in an environment that reduces risk of reversion to the first condition; and directing a scanning beam at the substrate while it is held stationary in the second station to form the bumps by the thermocapillary effect in the annular region of the substrate, wherein the height of bumps is controlled.

2. The method of claim 1 wherein the etching step includes sputter etching the surface of the substrate.

3. The method of claim 2 wherein the annular region is an inner annular region.

4. The method of claim 2, wherein the sputter etching step removes 1 to 1000 monolayers from the surface of the substrate.

5. The method of claim 1 wherein the series of stations includes a third station and further comprising the step of:

prior to the directing a scanning beam step, preheating the substrate to a start temperature while the substrate is temporarily held stationary in the third station to control the height of bumps to be formed in the annular region.

6. The method of claim 1 wherein the environment of the etching step is vacuum.

7. The method of claim 1 wherein the environment that reduces risk of reversion to the first condition is vacuum.

8. The method of claim 1 wherein the scanning beam is directed at the substrate in an inert atmosphere or vacuum.

9. The method of claim 8 wherein the inert atmosphere includes argon, helium, neon, or krypton.

* * * * *